(12) United States Patent
Oh et al.

(10) Patent No.: US 12,585,925 B2
(45) Date of Patent: Mar. 24, 2026

(54) SYSNAPSE CIRCUIT FOR PREVENTING ERRORS IN CHARGE CALCULATION AND SPIKE NEURAL NETWORK CIRCUIT INCLUDING THE SAME

(71) Applicant: ELECTRONICS AND TELECOMMUNICATIONS RESEARCH INSTITUTE, Daejeon (KR)

(72) Inventors: Kwang Il Oh, Daejeon (KR); Tae Wook Kang, Daejeon (KR); Hyuk Kim, Daejeon (KR); Jae-Jin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 961 days.

(21) Appl. No.: 17/834,484

(22) Filed: Jun. 7, 2022

(65) Prior Publication Data

US 2022/0405548 A1 Dec. 22, 2022

(30) Foreign Application Priority Data

Jun. 21, 2021 (KR) ........................ 10-2021-0080192
Oct. 22, 2021 (KR) ........................ 10-2021-0141484

(51) Int. Cl.
*G06N 3/04* (2023.01)
*G06N 3/049* (2023.01)
*H03K 19/20* (2006.01)
(52) U.S. Cl.
CPC ............. *G06N 3/049* (2013.01); *H03K 19/20* (2013.01)

(58) Field of Classification Search
CPC .............................. G06N 3/049; H03K 19/20
See application file for complete search history.

(56) References Cited

U.S. PATENT DOCUMENTS

| | | | |
|---|---|---|---|
| 9,053,428 B2 | 6/2015 | Hunzinger et al. | |
| 9,390,373 B2 | 7/2016 | Pescianschi | |
| 10,200,055 B2 * | 2/2019 | Enright | H03M 1/1038 |
| 10,248,906 B2 * | 4/2019 | Sumbul | G06N 3/049 |
| 10,839,900 B1 | 11/2020 | Kim et al. | |
| 12,073,311 B2 * | 8/2024 | Nomura | G06N 3/049 |
| 2009/0015454 A1 | 1/2009 | Sugai | |
| 2016/0364643 A1 * | 12/2016 | Cruz-Albrecht | G06N 3/049 |
| 2019/0318232 A1 * | 10/2019 | Cruz-Albrecht | G06N 3/049 |
| 2020/0160146 A1 | 5/2020 | Oh et al. | |
| 2020/0174751 A1 | 6/2020 | Cho et al. | |
| 2022/0121911 A9 * | 4/2022 | Cruz-Albrecht | G06N 3/065 |

(Continued)

FOREIGN PATENT DOCUMENTS

| | | |
|---|---|---|
| JP | 2009-21757 A | 1/2009 |
| JP | 6382354 B2 | 8/2018 |

(Continued)

*Primary Examiner* — Paulinho E Smith

(57) ABSTRACT

Disclosed is a synaptic circuit including a weight memory that stores a weight value, a current-mode digital-to-analog converter (C-DAC) circuit that receives the weight value from the weight memory and supplies a current based on the weight value, a parasitic capacitor correction circuit that receives the weight value from the weight memory and to correct a value of parasitic capacitance generated by the C-DAC circuit based on the weight value, and a pre-discharge circuit that drains charges accumulated by the parasitic capacitance.

13 Claims, 8 Drawing Sheets

(56)  References Cited

U.S. PATENT DOCUMENTS

| 2022/0253673 A1 * | 8/2022 | Oh | G06N 3/063 |
| 2022/0269932 A1 * | 8/2022 | Nomura | G06N 3/044 |
| 2022/0391669 A1 * | 12/2022 | Oh | G06N 3/063 |
| 2023/0385619 A1 * | 11/2023 | Okazaki | G11C 13/0002 |

FOREIGN PATENT DOCUMENTS

| KR | 101512370 B1 | 4/2015 |
| KR | 101596656 B1 | 2/2016 |
| KR | 10-2018-0088258 A | 8/2018 |
| KR | 101901718 B1 | 8/2018 |

* cited by examiner

SYSNAPSE CIRCUIT FOR PREVENTING ERRORS IN CHARGE CALCULATION AND SPIKE NEURAL NETWORK CIRCUIT INCLUDING THE SAME

CROSS-REFERENCE TO RELATED APPLICATIONS

This application claims priority under 35 U.S.C. § 119 to Korean Patent Application No. 10-2021-0080192 filed on Jun. 21, 2021 and No. 10-2021-0141484 filed on Oct. 22, 2021, in the Korean Intellectual Property Office, the disclosures of which are incorporated by reference herein in their entireties.

BACKGROUND

Embodiments of the present disclosure described herein relate to an artificial intelligence technology, and more particularly, relate to a synaptic circuit for preventing errors in charge calculation and a spike neural network (SNN) circuit including the same.

SNN is a type of artificial neural network (ANN), and refers to a neural network in which neurons included in a neural network model communicate through a sequence of spikes. Neural networks designed based on spiking neurons may process large amounts of data with the relatively small number of spikes. The SNN is similar to a biological neural network. Accordingly, in addition to neural information processing, the SNN may be used in various fields such as signal processing, event detection, classification, spatial search, or motor manipulation.

Other neural networks use a numerical value having a specific magnitude for calculation in a neural network. On the other hand, the SNN uses a pulse signal having short duration for calculation in a neural network. In more detail, the SNN receives a pulse of a specific period as an input of a neural network, performs a neural network operation according to the input at a specific node, and delivers a spike to the next node depending on a preset spike delivery path. However, because charges by parasitic capacitance as well as charges by a current source included in a synapse are additionally shared, a calculation result of the neural network is different from a result value normally derived in the SNN.

SUMMARY

Embodiments of the present disclosure provide a synaptic circuit for preventing errors in charge calculation and an SNN circuit including the same in implementing SNN.

According to an embodiment, a synaptic circuit includes a weight memory that stores a weight value, a current-mode digital-to-analog converter (C-DAC) circuit that receives the weight value from the weight memory and supplies a current based on the weight value, a parasitic capacitor correction circuit that receives the weight value from the weight memory and to correct a value of parasitic capacitance generated by the C-DAC circuit based on the weight value, and a pre-discharge circuit that drains charges accumulated by the parasitic capacitance.

For example, the weight value is an n-bit binary number.

For example, the C-DAC circuit includes 'n' PMOS transistors and 'n' switches, and the parasitic capacitor correction circuit includes one inverter and 'n' switches. The parasitic capacitance is generated based on whether the 'n' switches included in the C-DAC circuit are opened or closed, with respect to the C-DAC circuit. The parasitic capacitance is generated based on the 'n' switches included in the parasitic capacitor correction circuit are opened or closed, with respect to the parasitic capacitor correction circuit.

For example, it is determined, based on the weight value, whether the 'n' switches included in the C-DAC circuit are opened or closed. It is determined, based on a result of inverting the weight value through the one inverter, whether the 'n' switches included in the parasitic capacitor correction circuit are opened or closed.

For example, the 'n' bits are 8 bits.

According to an embodiment, a spike neural network (SNN) circuit includes a synaptic circuit array including a plurality of synaptic circuits arranged in 'n' rows and 'm' columns, a plurality of spike generators electrically connected to correspond to the 'n' rows, respectively, a plurality of neuron circuits electrically connected to correspond to the 'm' columns, respectively, and a plurality of membrane capacitors electrically connected to correspond to the 'm' columns, respectively. Each of the plurality of synaptic circuits includes a weight memory that stores a weight value, a C-DAC circuit that receives the weight value from the weight memory and supplies a current based on the weight value, a parasitic capacitor correction circuit that receives the weight value from the weight memory and corrects a value of parasitic capacitance generated by the C-DAC circuit based on the weight value, and a pre-discharge circuit that drains charges accumulated by the parasitic capacitance.

For example, the weight value is an n-bit binary number.

For example, the C-DAC circuit includes 'n' PMOS transistors and 'n' switches, and the parasitic capacitor correction circuit includes one inverter and 'n' switches. The parasitic capacitance is generated based on whether the 'n' switches included in the C-DAC circuit are opened or closed, with respect to the C-DAC circuit. The parasitic capacitance is generated based on the 'n' switches included in the parasitic capacitor correction circuit are opened or closed, with respect to the parasitic capacitor correction circuit.

For example, it is determined, based on the weight value, whether the 'n' switches included in the C-DAC circuit are opened or closed. It is determined, based on a result of inverting the weight value through the one inverter, whether the 'n' switches included in the parasitic capacitor correction circuit are opened or closed.

For example, a first neuron circuit among the plurality of neuron circuits receives a signal accumulated from a plurality of synaptic circuits arranged in a first column of the synaptic circuit array. When a potential by the accumulated signal exceeds a fire reference potential of the first neuron circuit, the first neuron circuit outputs a spike voltage.

For example, each of the plurality of spike generator includes a first NAND operator for outputting a spike sub-voltage and a second NAND operator for outputting a spike main voltage.

For example, the first NAND operator receives a first voltage, which is an input voltage entered into each of the plurality of spike generator, and a second voltage generated after the input voltage passes through five inverters connected in series and generates the spike sub-voltage by performing a NAND operation on the first voltage and the second voltage. The second NAND operator receives the first voltage and a third voltage generated after the input voltage passes through six inverters connected in series and generates the spike main voltage by performing the NAND operation on the first voltage and the third voltage.

For example, the 'n' bits are 8 bits.

BRIEF DESCRIPTION OF THE FIGURES

The above and other objects and features of the present disclosure will become apparent by describing in detail embodiments thereof with reference to the accompanying drawings.

FIG. 1 is a diagram illustrating a synaptic circuit, according to an embodiment of the present disclosure.

FIGS. 2A and 2B are diagrams for describing an operation of a synaptic circuit, according to an embodiment of the present disclosure.

DETAILED DESCRIPTION

Figure 2A:
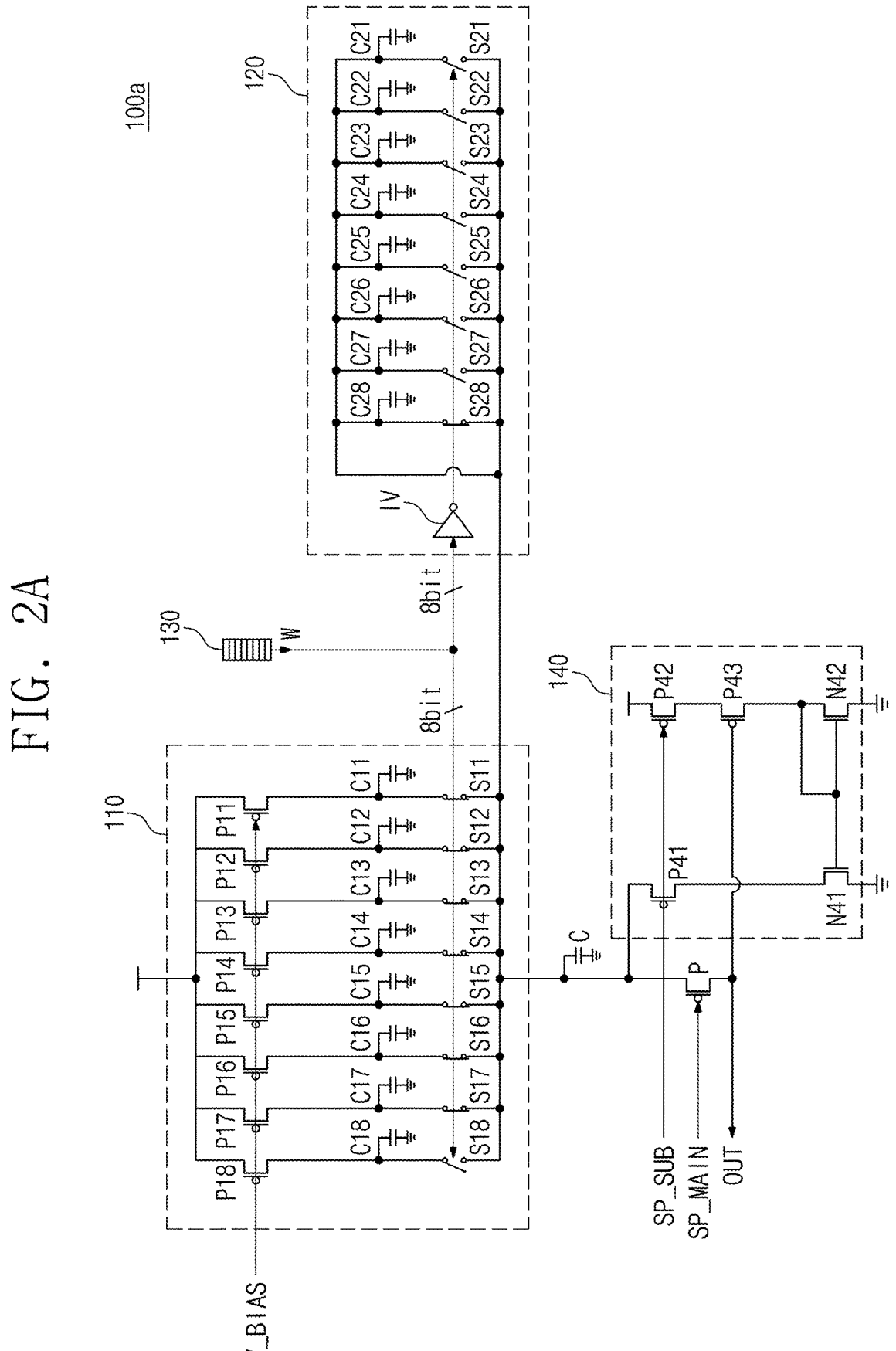

Hereinafter, embodiments of the present disclosure will be described in detail and clearly to such an extent that an ordinary one in the art easily implements the present disclosure.

The terms used in the specification are provided to describe embodiments, not to limit the present disclosure. As used in the specification, the singular terms "a," "an" and "the" are intended to include the plural forms as well, unless the context clearly indicates otherwise. The terms "comprises" and/or "comprising," when used in the specification, specify the presence of steps, operations, elements, and/or components, but do not preclude the presence or addition of one or more other steps, operations, elements, components, and/or groups thereof.

In the specification, the term "first and/or second" will be used to describe various elements but will be described only for the purpose of distinguishing one element from another element, not limiting an element of the corresponding term. For example, without departing the scope of the present disclosure, a first element may be referred to as a second element, and similarly, a second element may be referred to as a first element.

Unless otherwise defined, all terms (including technical and scientific terms) used in the specification should have the same meaning as commonly understood by those skilled in the art to which the present disclosure pertains. The terms, such as those defined in commonly used dictionaries, should not be interpreted in an idealized or overly formal sense unless expressly so defined herein. The same reference numerals represent the same elements throughout the specification.

Figure 1:
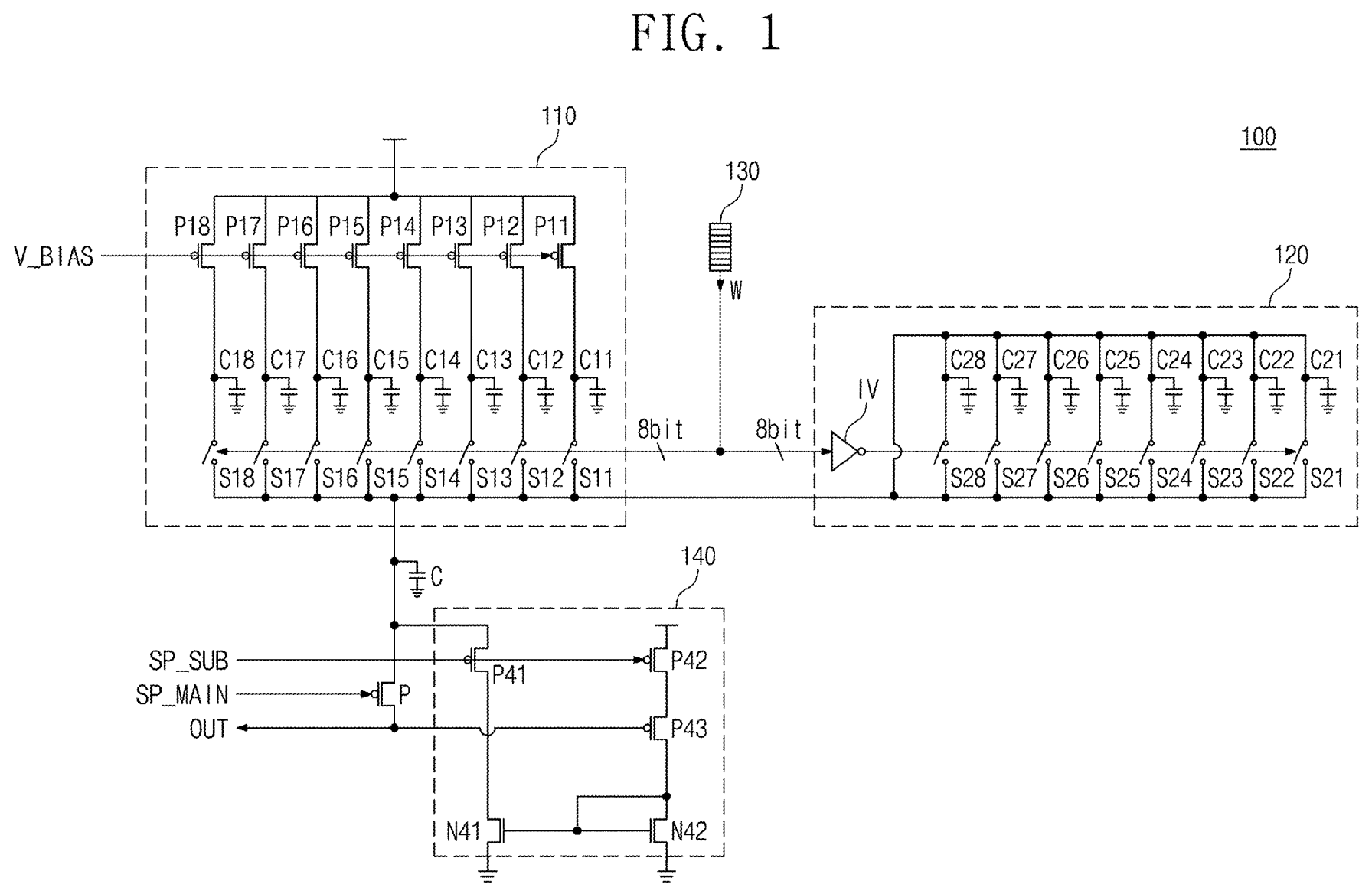

FIG. 1 is a diagram illustrating a synaptic circuit 100, according to an embodiment of the present disclosure. Referring to FIG. 1, according to an embodiment of the present disclosure, a synaptic circuit 100 may include a current-mode digital-to-analog converter (C-DAC) circuit 110, an axon PMOS P, an axon capacitor C, a parasitic capacitor correction circuit 120, a weight memory 130, and a pre-discharge circuit 140.

The C-DAC circuit 110 may supply electric charges to a membrane capacitor to be shown later based on a weight value W stored in the weight memory 130. The C-DAC circuit 110 may convert the weight value W provided from the weight memory 130 into a current value. Referring to FIG. 1, it is illustrated that the weight value W provided from the weight memory 130 is a value corresponding to 8 bits, but this is only an example. For example, the weight value W does not limit the number of bits of the weight value W.

The C-DAC circuit 110 may include a plurality of PMOSs P11, P12, . . . , and P18 and a plurality of switches S11, S12, . . . , and S18, which correspond to the number of bits of the weight value W. One end of each of the plurality of switches S11, S12, . . . , and S18 may be connected in series to one end of each of the plurality of PMOSs P11, P12, . . . , and P18. Parasitic capacitance corresponding to each of the plurality of PMOSs P11, P12, . . . , and P18 may occur in the C-DAC circuit 110 based on whether each of the plurality of switches S11, S12, . . . , and S18 is opened or closed. For convenience of description, in the parasitic capacitance occurring according to an embodiment of the present disclosure, it will be described that a parasitic capacitor C11, C12, . . . , or C18 is present. However, the parasitic capacitor C11, C12, . . . , or C18 is not implemented as a physical component, but it will be understood as a capacitor conceptually generated by an operation of opening and closing each of the plurality of switches S11, S12, . . . , and S18.

In more detail, one end of the first PMOS P11 included in the C-DAC circuit 110 may be connected to the first parasitic capacitor C11. In addition, one end of the first PMOS P11 included in the C-DAC circuit 110 may be connected to the first switch S11. One end of the second PMOS P12 included in the C-DAC circuit 110 may be connected to the second parasitic capacitor C12. Besides, one end of the second PMOS P12 included in the C-DAC circuit 110 may be connected to the second switch S12.

That is, one PMOS, one capacitor, and one switch may constitute one C-DAC unit. In an embodiment disclosed in FIG. 1, the first to eighth C-DAC units may be positioned in parallel. The first C-DAC unit refers to a unit consisting of the first PMOS P11, the first parasitic capacitor C11, and the first switch S11. The eighth C-DAC unit refers to a unit consisting of the eighth PMOS P18, the eighth parasitic capacitor C18, and the eighth switch S18.

The source and drain of each of the plurality of PMOSs P11, P12, . . . , and P18 may be connected to each other or opened by an electron channel depending on the potential of each gate input. When the source and the drain are connected by the electron channel, it may be referred to as "turn-on". Otherwise, it may be referred to as "turn-off". A gate voltage V_BIAS may be applied to a gate of each of the plurality of PMOSs P11, P12, . . . , and P18. It may be determined whether the C-DAC unit is energized, based on whether the plurality of switches S11, S12, . . . , and S18 are opened or closed. The detailed operation of the C-DAC circuit 110 will be described in more detail with reference to FIGS. 2A and 2B to be described later.

One end of the axon PMOS P may be connected to one end of the C-DAC circuit 110. One end of the axon capacitor C may also be connected to one end of the C-DAC circuit 110. As in the C-DAC circuit 110, a main spike voltage SP_MAIN may be applied as a gate voltage to the gate of the axon PMOS P.

The parasitic capacitor correction circuit 120 is a circuit for preventing errors in charge calculation due to a potential mismatch caused by the parasitic capacitors C11, C12, . . . , and C18 included in the C-DAC circuit 110.

Referring to FIG. 1, the parasitic capacitor correction circuit 120 may include an inverter IV and a plurality of switches S21, S22, . . . , and S28.

For the purpose of minimizing errors in charge calculation caused by the parasitic capacitors C11, C12, . . . , and C18 included in the C-DAC circuit 110, the parasitic capacitor correction circuit 120 may correct the synaptic circuit 100 such that the charge calculation is made for the parasitic capacitors C11, C12, . . . , and C18 having constant values. As in the C-DAC circuit 110, it is illustrated that the weight value W provided from the weight memory 130 to the parasitic capacitor correction circuit 120 is a value corresponding to 8 bits, but this is only an example. For example, the weight value W does not limit the number of bits of the weight value W.

Each of the plurality of switches S21, S22, . . . , and S28 included in the parasitic capacitor correction circuit 120 may be arranged in a parallel structure, and the parasitic capacitance may occur based on whether each of the plurality of switches S21, S22, . . . , and S28 is opened or closed. For convenience of description, in the present disclosure, it will be described that the parasitic capacitance occurring in the parasitic capacitor correction circuit 120 is also present in the parasitic capacitor C21, C22, . . . , or C28. However, the parasitic capacitor C21, C22, . . . , or C28 is not implemented as a physical component, but it will be understood as a capacitor conceptually generated by an operation of opening and closing each of the plurality of switches S21, S22, . . . , and S28. The detailed operation of the parasitic capacitor correction circuit 120 will be described in more detail with reference to FIGS. 2A and 2B to be described later.

The weight memory 130 may store the weight value W used in neural network computation. The weight memory 130 may determine whether to open or close the plurality of switches S11, S12, . . . , and S18 included in the C-DAC circuit 110 and the plurality of switches S21, S22, . . . , and S28 included in the parasitic capacitor correction circuit 120, by providing the stored weight value W to the C-DAC circuit 110 and the parasitic capacitor correction circuit 120.

The pre-discharge circuit 140 refers to a circuit for preventing charge sharing by the potential mismatch between the parasitic capacitors C11, C12, . . . , and C18 and a membrane capacitor immediately before the charge calculation in the synaptic circuit 100. The pre-discharge circuit 140 may include three PMOSs P41, P42, and P43 and two NMOSs N41 and N42. The first PMOS P41 and the second PMOS P42 may receive a spike sub-voltage SP_SUB as a gate voltage through gate terminals of the first PMOS P41 and the second PMOS P42. The third PMOS P43 may output an output voltage OUT to the outside of the synaptic circuit 100.

The pre-discharge circuit 140 may adjust the amount of current by using a current mirror such that the potential of the parasitic capacitor is equal to the potential of the membrane capacitor. Effects of the present disclosure including the pre-discharge circuit 140 will be described in detail with reference to FIGS. 5A and 5B which will be described later.

Figure 2B:
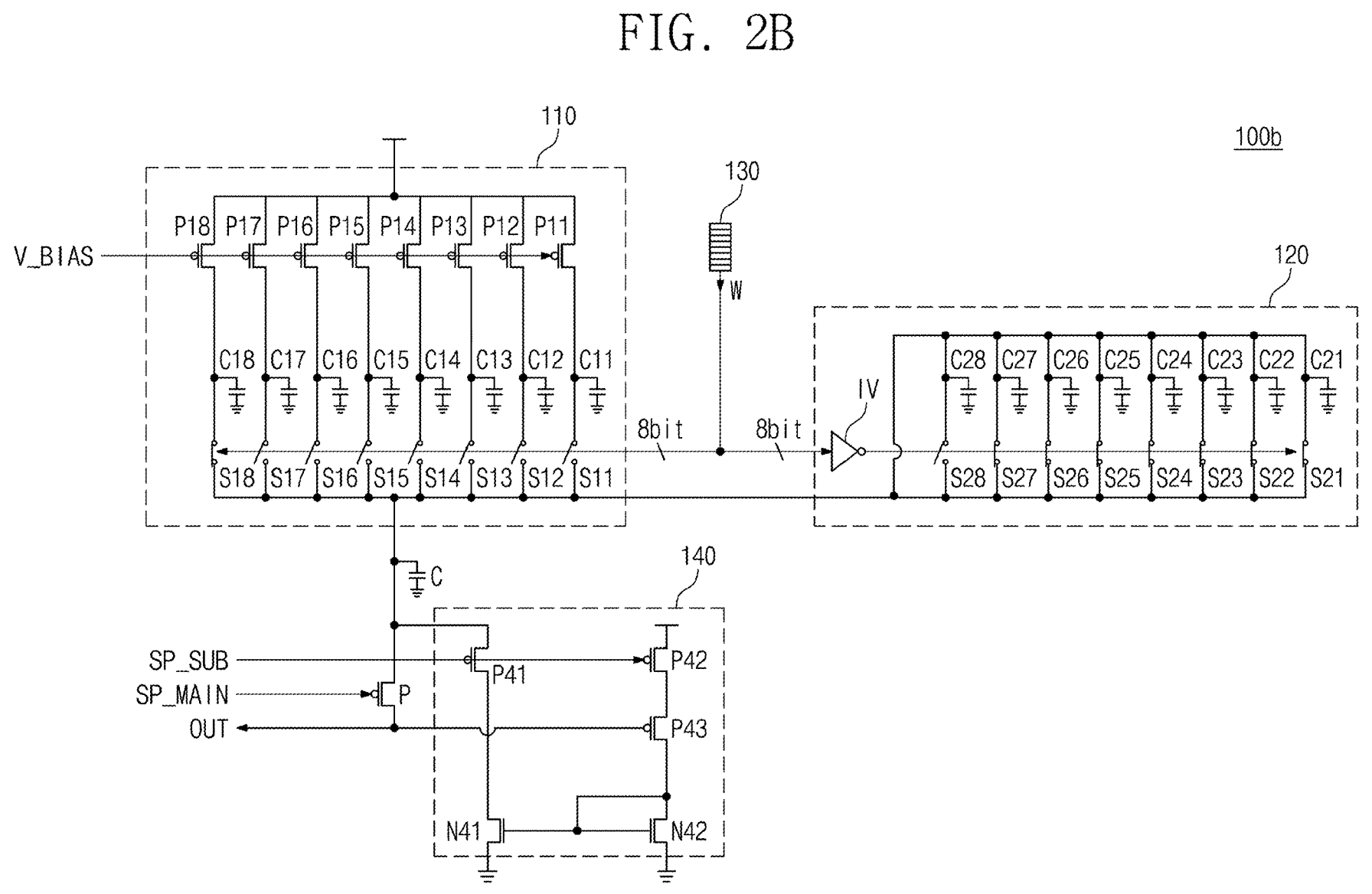

FIGS. 2A and 2B are diagrams for describing an operation of the synaptic circuit 100 (see FIG. 1), according to an embodiment of the present disclosure. In more detail, FIG. 2A is a diagrams for describing an embodiment 100*a* when the weight value W of "10000000" is provided from the weight memory 130. FIG. 2B is a diagram for describing an embodiment 100*b* when the weight value W of "01111111" is provided from the weight memory 130.

Referring to FIG. 2A, when the weight value W is provided as "10000000", the first to seventh switches S11 to S17 included in the C-DAC circuit 110 may be closed, and the eighth switch S18 may be opened. Moreover, when the weight value W is provided as "10000000", the first to seventh switches S21 to S27 included in the parasitic capacitor correction circuit 120 may be opened, and the eighth switch S28 may be closed.

In a conventional synaptic circuit, when the bias voltage V_BIAS is applied to gates of the plurality of PMOSs P11, P12, . . . , and P18 included in the C-DAC circuit 110 and the spike main voltage SP_MAIN having a value of logic low (0) is applied to the axon PMOS P, it may be determined that the first to seventh parasitic capacitors C11 to C17 included in the C-DAC circuit 110 and the axon capacitor C are present. Assuming that the capacity of each of the first to seventh parasitic capacitors C11 to C17 and the axon capacitor C is 'C', the total capacity of the capacitors may be calculated as '8C'.

On the other hand, in the synaptic circuit 100*a* according to an embodiment of the present disclosure, when the bias voltage V_BIAS is applied to the gates of a plurality of PMOSs P11, P12, . . . , and P18 included in the C-DAC circuit 110 and the spike main voltage SP_MAIN having a value of logic low (0) is applied to the axon PMOS P, it may be determined that the first to seventh parasitic capacitors C11 to C17 included in the C-DAC circuit 110, the axon capacitor C, and the eighth parasitic capacitor C28 included in the parasitic capacitor correction circuit 120 are present. Assuming that the capacity of each of the first to seventh parasitic capacitors C11 to C17, the capacity of the axon capacitor C, and the capacity of the eighth parasitic capacitor C28 included in the parasitic capacitor correction circuit 120 are 'C', the total capacity of the capacitors may be calculated as '9C'.

Referring to FIG. 2B, when the weight value W is provided as "01111111", the first to seventh switches S11 to S17 included in the C-DAC circuit 110 may be opened, and the eighth switch S18 may be closed. Moreover, when the weight value W is provided as "01111111", the first to seventh switches S21 to S27 included in the parasitic capacitor correction circuit 120 may be closed, and the eighth switch C28 may be opened.

In the conventional synaptic circuit, when the bias voltage V_BIAS is applied to the gates of the plurality of PMOSs P11, P12, . . . , and P18 included in the C-DAC circuit 110 and the spike main voltage SP_MAIN having a value of logic low (0) is applied to the axon PMOS P, it may be determined that the eighth parasitic capacitor C18 included in the C-DAC circuit 110 and the axon capacitor C are present. Assuming that each of the capacity of the eighth parasitic capacitor C18 and the capacity of the axon capacitor C is 'C', the total capacity of the capacitors may be calculated as '2C'.

On the other hand, in the synaptic circuit 100*b* according to an embodiment of the present disclosure, when the bias voltage V_BIAS is applied to the gates of a plurality of PMOSs P11, P12, . . . , and P18 included in the C-DAC circuit 110 and the spike main voltage SP_MAIN having a value of logic low (0) is applied to the axon PMOS P, it may be determined that the eighth parasitic capacitor C18 included in the C-DAC circuit 110, the axon capacitor C, and the first to seventh parasitic capacitors C21 to C27 included in the parasitic capacitor correction circuit 120 are present. Assuming that the capacity of the eighth parasitic capacitor C18 included in the C-DAC circuit 110, the capacity of the axon capacitor C, and the capacity of each of the first to seventh parasitic capacitors C21 to C27 included in the parasitic capacitor correction circuit 120 are 'C', the total capacity of the capacitors may be calculated as '9C'.

That is, in the synaptic circuit 100 according to an embodiment of the present disclosure, the total capacity of the capacitors may be uniformly maintained regardless of the weight value W. Accordingly, the amount of charges supplied by the parasitic capacitor may be maintained uniformly.

Figure 3:
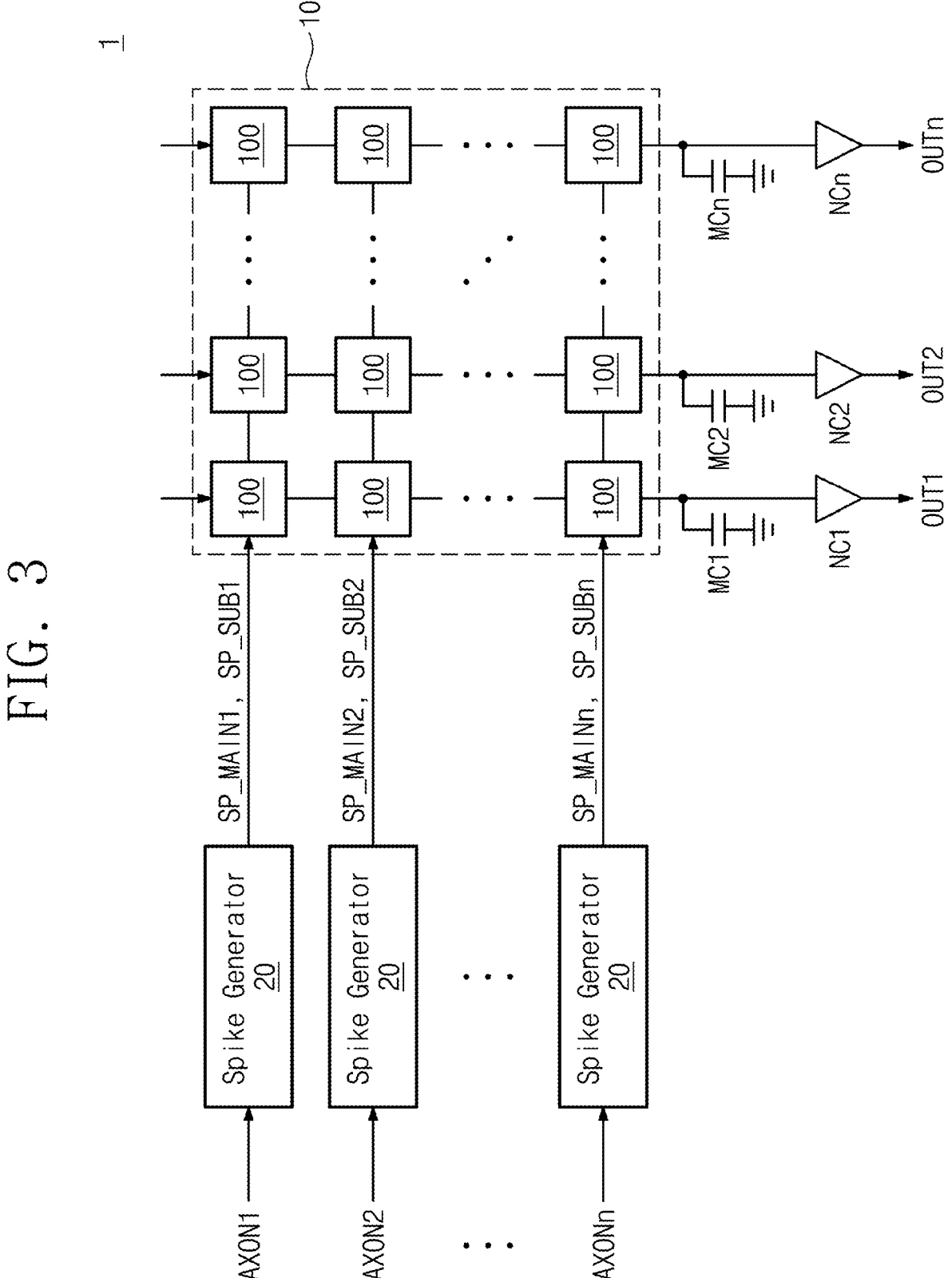
FIG. 3 is a diagram illustrating an SNN circuit, according to an embodiment of the present disclosure.

FIG. 3 is a diagram illustrating an SNN circuit 1, according to an embodiment of the present disclosure. Referring to FIG. 3, the SNN circuit 1 according to an embodiment of the present disclosure includes a synaptic circuit array 10, a plurality of spike generators 20, a plurality of membrane capacitors MC1, MC2, . . . , and MCn and a plurality of neuron circuits NC1, NC2, . . . , and NCn.

The synaptic circuit array 10 has a shape in which the synaptic circuit 100 disclosed in FIG. 1 is arranged in 'n' rows and 'n' columns. The synaptic circuit array 10 is illustrated as an n×n array in FIG. 3, but it is not limited to a square arrangement. In other words, the synaptic circuit array 10 may be an n×m array (each of 'n' and 'm' is a natural number).

The synaptic circuits 100 present in the same row in the synaptic circuit array 10 may receive a spike voltage from the one spike generator 20. The spike voltage may include the spike main voltage SP_MAIN (see FIG. 1) and the spike sub-voltage SP_SUB (see FIG. 1). For example, the synaptic circuits 100 present in the first row may receive a first spike main voltage SP_MAIN1 and a first spike sub-voltage SP_SUB1.

Moreover, the synaptic circuits 100 present in the same column in the synaptic circuit array 10 may be connected in a parallel structure that shares the membrane capacitors MC1, MC2, . . . , and MCn. The spike generators 20 may generate spike main voltages SP_MAIN1, SP_MAIN2, . . . , and SP_MAINn and spike sub-voltages SP_SUB1, SP_SUB2, . . . , and SP_SUBn based on axon voltages AXON1, AXON2, . . . , and AXONn, respectively. The detailed operation of the spike generator 20 will be described in detail with reference to FIGS. 4A and 4B, which will be described later.

The synaptic circuits 100 present in the same column in the synaptic circuit array 10 may constitute a membrane based on the spike main voltages SP_MAIN1, SP_MAIN2, . . . , and SP_MAINn and the spike sub-voltages SP_SUB1, SP_SUB2, . . . , and SP_SUBn provided from the spike generator 20. One membrane may accumulate signals received from the synaptic circuit 100 and may provide signals as inputs of the neuron circuits NC1, NC2, . . . , and NCn. Each of the neuron circuits NC1, NC2, . . . , and NCn may determine whether to fire the corresponding neuron circuit NC1, NC2, . . . , or NCn, based on whether a fire boundary point is excessed based on a fire reference potential of the corresponding neuron circuit NC1, NC2, . . . , or NCn.

When the neuron circuits NC1, NC2, . . . , and NCn fire, the neuron circuits NC1, NC2, . . . , and NCn may output output spike voltages OUT1, OUT2, . . . , and OUTn, and the voltage of the membrane that outputs the output spike voltages OUT1, OUT2, . . . , and OUTn may return to an initial value.

In the case of a conventional SNN circuit, when parasitic capacitors in the synaptic circuit 100 are not corrected, charges by parasitic capacitors may be delivered to membrane capacitors MC1, MC2, . . . , and MCn. Accordingly, because unnecessary charges from the membrane capacitors MC1, MC2, . . . , and MCn are supplied to the neuron circuits NC1, NC2, . . . , and NCn, it may cause errors in charge calculation. However, the SNN circuit 1 according to an embodiment of the present disclosure may uniformly maintain the capacity of a capacitor generated by the synaptic circuit 100 through the parasitic capacitor correction circuit 120 (see FIG. 1), thereby preventing unnecessary charges from being supplied to the membrane capacitors MC1, MC2, . . . , and MCn by pre-discharging charges caused by the parasitic capacitor through the pre-discharge circuit 140 (see FIG. 1).

Figure 4A:
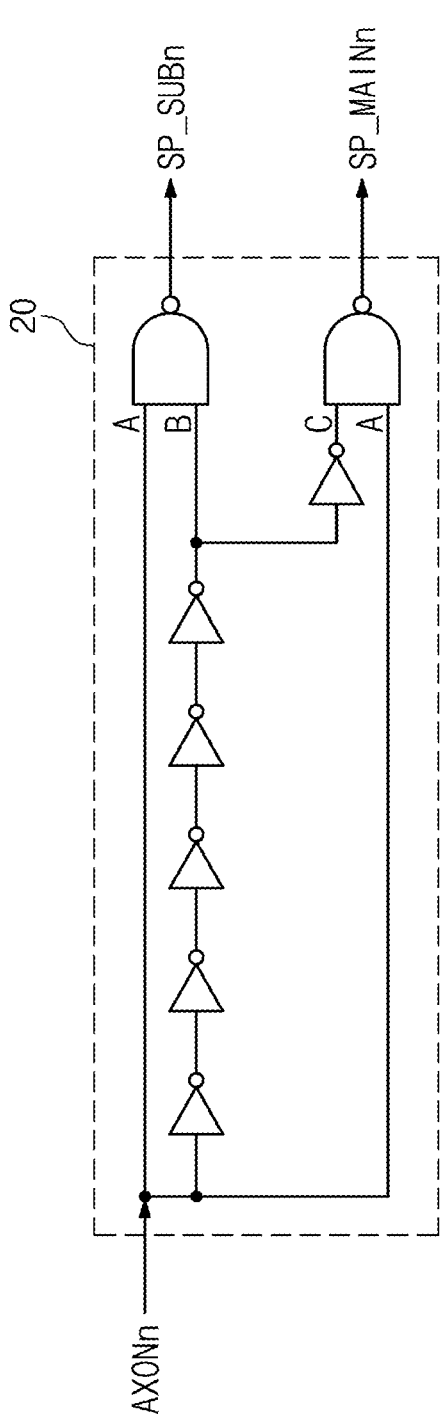
FIGS. 4A and 4B are diagrams illustrating an operation of a spike generator, according to an embodiment of the present disclosure.
Figure 4B:
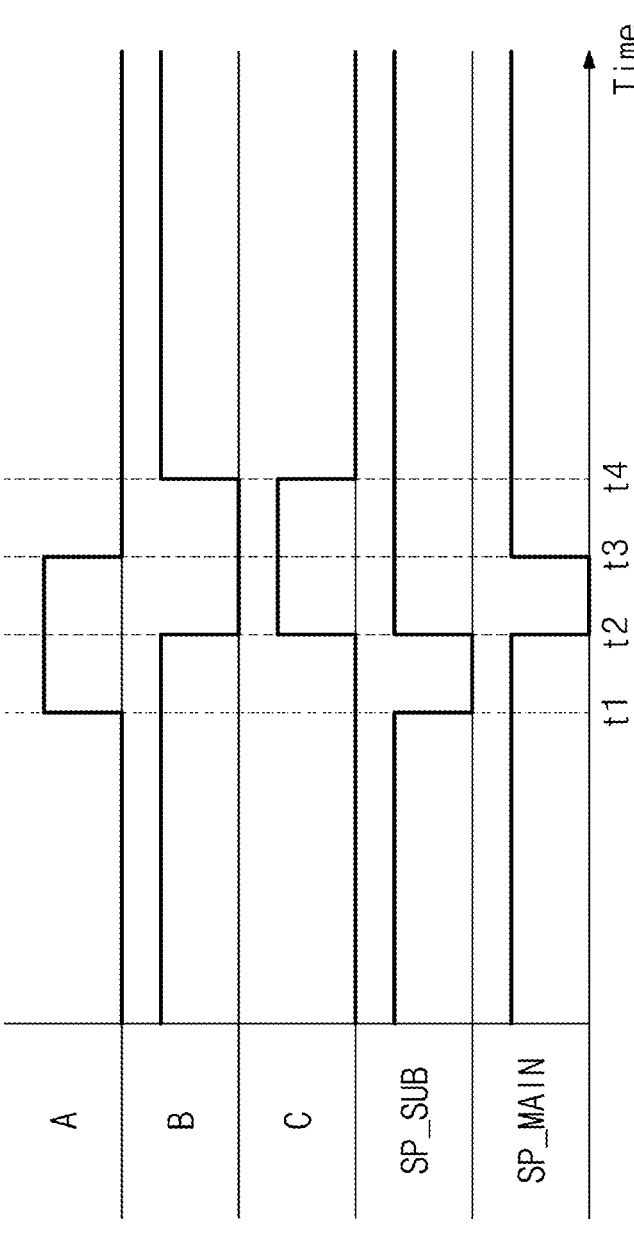

FIGS. 4A and 4B are diagrams illustrating an operation of the spike generator 20, according to an embodiment of the present disclosure. More specifically, FIG. 4A shows a circuit diagram of the spike generator 20 included in the SNN circuit 1, according to an embodiment of the present disclosure. FIG. 4B is a timing diagram illustrating aspects of the spike main voltage SP_MAINn and the spike sub-voltage SP_SUBn generated from the spike generator 20.

Referring to FIG. 4A, the spike generator 20 according to an embodiment of the present disclosure may include six inverters and two NAND operators. The two NAND operators may derive the spike sub-voltage SP_SUBn and the spike main voltage SP_MAINn, respectively. The spike generator 20 may receive the axon voltage AXONn in a form of a pulse from the outside. The first NAND operator may receive a first voltage 'A' equal to the axon voltage AXONn from one terminal. The first NAND operator may receive a second voltage 'B', which is obtained as the axon voltage AXONn passes through five inverters arranged in series, through the other terminal. The first NAND operator may perform a NAND operation on the first voltage 'A' and the second voltage 'B', and may generate the spike sub-voltage SP_SUBn as a result.

In the meantime, the second NAND operator of the spike generator 20 may receive a third voltage 'C', which is obtained as the axon voltage AXONn passes through six inverters arranged in series, from one terminal. The second NAND operator of the spike generator 20 may receive the first voltage 'A' equal to the axon voltage AXONn from the other terminal. The second NAND operator may perform a NAND operation on the first voltage 'A' and the third voltage 'C' and may generate the spike main voltage SP_MAINn as a result.

Referring to FIG. 4B, it is possible to identify changes of the spike sub-voltage SP_SUB and the spike main voltage SP_MAIN generated by the spike generator 20. In the example shown in FIG. 4B, assuming that the axon voltage AXONn is the same as the first voltage 'A', the axon voltage AXONn has a value of logic high (1) in a section between t1 and t3 and has a value of logic low (0) in the other sections. The second voltage 'B' is obtained by applying the first voltage 'A' to five inverters arranged in series. That is, the second voltage 'B' is obtained by inverting a voltage from delaying the first voltage 'A' by "t2−t1". Accordingly, the second voltage 'B' has a value of logical low in a section between t2 and t4, and has a value of logic high in other sections. The third voltage 'C' is obtained by applying the first voltage 'A' to six inverters arranged in series. That is, the third voltage 'C' is obtained by delaying the first voltage 'A' by "t2−t1". Accordingly, the third voltage 'C' has a value of logical high in a section between t2 and t4, and has a value of logic low in other sections.

As a result of performing a NAND operation on the first voltage 'A' and the second voltage 'B', the spike sub-voltage SP_SUB has a value of logical low in a section between t1 and t2, and has a value of logic high in other sections. As a result of performing a NAND operation on the first voltage 'A' and the third voltage 'C', the spike main voltage SP_MAIN has a value of logical low in a section between t2 and t3, and has a value of logic high in other sections.

Figure 5A:
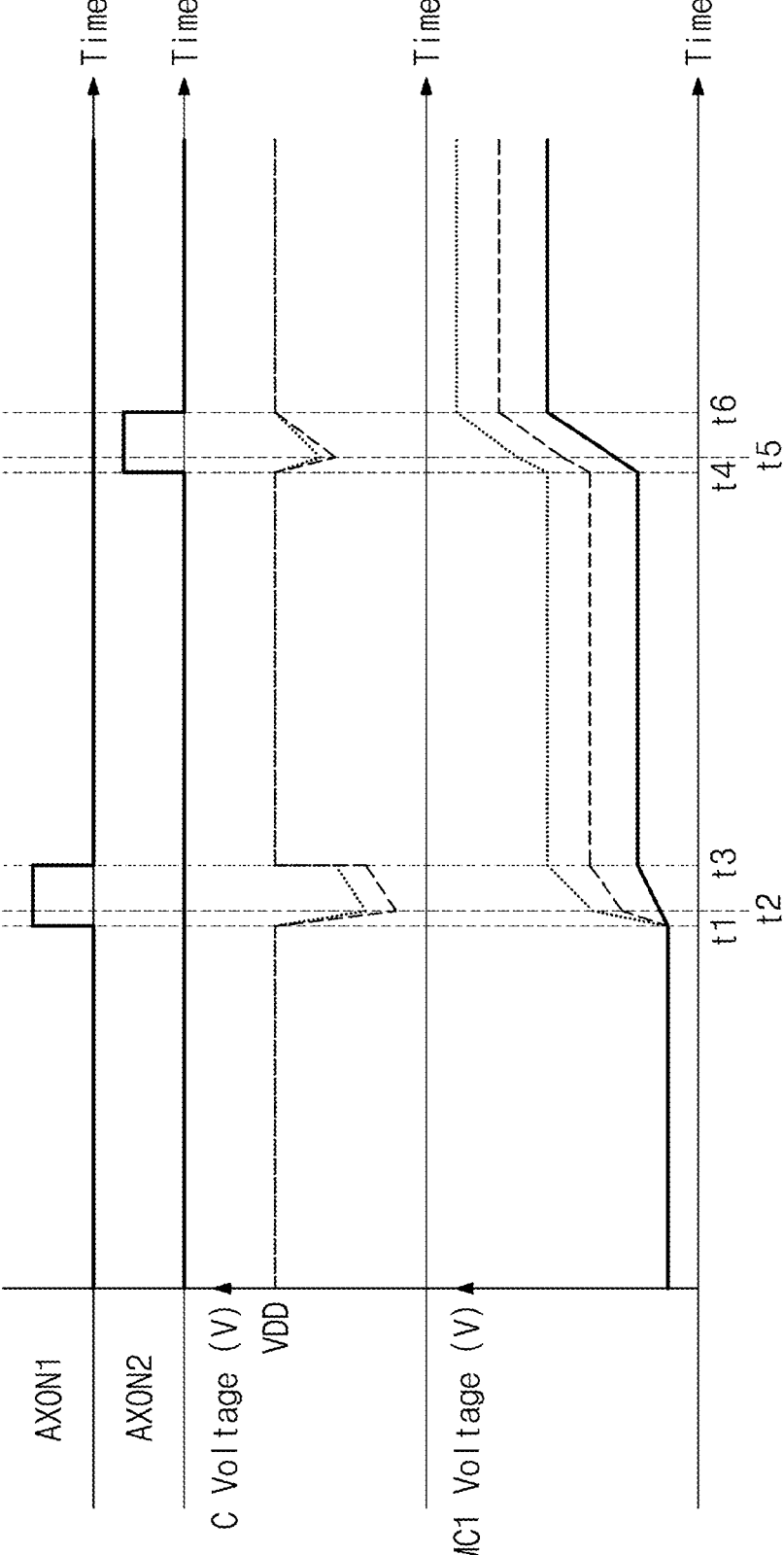
FIGS. 5A and 5B are diagrams for comparing operation results of the conventional SNN circuit and an SNN circuit, according to an embodiment of the present disclosure.
Figure 5B:
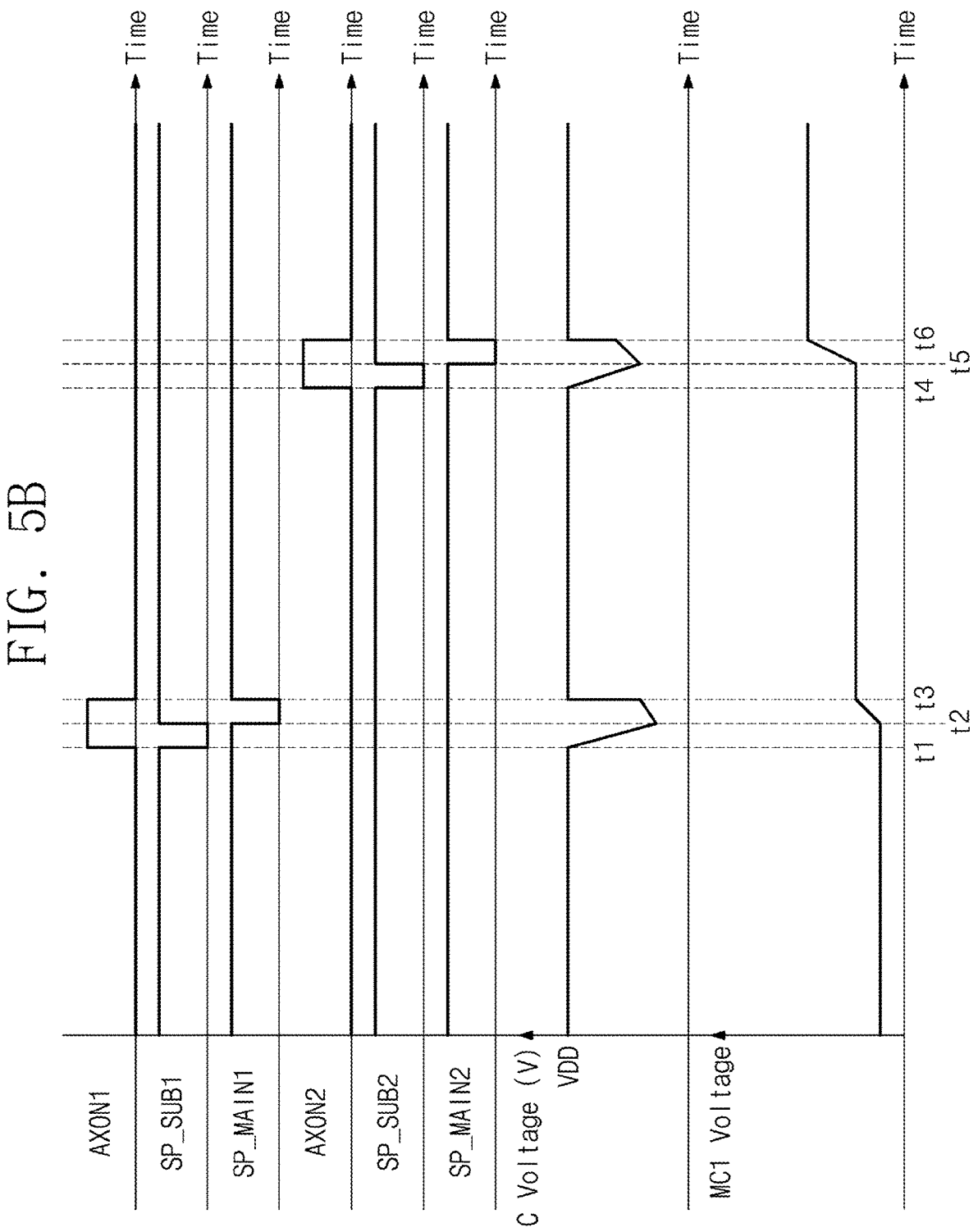

FIGS. 5A and 5B are diagrams for comparing operation results of the conventional SNN circuit and the SNN circuit 1 (see FIG. 3), according to an embodiment of the present disclosure.

FIG. 5A is an operation result of the conventional SNN circuit, and is a diagram illustrating an operation result in the case where the parasitic capacitor correction circuit 120 (see FIG. 1) is not present. As described in FIG. 2A, a solid line shown as "8C" for the parasitic capacitor voltage 'C' and the membrane voltage MC1 corresponds to a case that a weight value of "1000000" is applied. As described in FIG. 2B, a dotted line shown as "2C" for the parasitic capacitor voltage 'C' and the membrane voltage MC1 corresponds to a case that the weight value of "01111111" is applied.

Referring to FIG. 5A, in a section between t1 and t3 in which the first axon voltage AXON1 is applied as logic high, the values of the parasitic capacitor voltage 'C' and the membrane voltage MC1 may be changed. In a section between t1 and t2, charges are leaked from a parasitic capacitor to the membrane capacitor MC (see FIG. 3), and thus the parasitic capacitor voltage 'C' decreases. Moreover, in the section between t1 and t2, the membrane voltage MC1 increases due to the accumulation of charges by a plurality of PMOSs turned on in response to the gate voltage V_BIAS and a current determined based on whether a plurality of switches are opened or closed. Because the amount of charges drained when the capacity of a parasitic capacitor is "8C" is different from the amount of charges drained when the capacity of a parasitic capacitor is "2C", the changed amount of charges is also different. The same principle may be applied to a section between t4 and t6 in which a second axon voltage AXON2 is applied as logic high.

On the other hand, referring to FIG. 5B, in a section between t1 and t3 in which the first axon voltage AXON is applied as logic high, the first spike sub-voltage SP_SUB1 has a value of logic low in the section between t1 and t2, and the first spike main voltage SP_MAIN1 has a value of logic low in a section between t2 and t3. Because the SNN circuit 1 (see FIG. 3) according to an embodiment of the present disclosure includes a parasitic capacitor correction circuit 120 (see FIG. 1), the SNN circuit 1 may have the capacity of a parasitic capacitor, which is always uniform, regardless of the weight value thus applied. Furthermore, because the SNN circuit 1 according to an embodiment of the present disclosure includes the pre-discharge circuit 140 (see FIG. 1), the SNN circuit 1 may pre-discharge the specific amount of charges accumulated in a parasitic capacitor having a specific magnitude. Accordingly, the parasitic capacitor voltage 'C' occurring in the section between t1 and t2 uniformly decreases regardless of the weight value, and the membrane voltage MC1 also uniformly increases.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. Accordingly, it will be apparent to those of ordinary skill in the art that various changes and modifications may be made to the above embodiments without departing from the spirit and scope of the present disclosure as set forth in the following claims According to an embodiment of the present disclosure, it is possible to minimize calculation errors based on charge sharing caused by a potential mismatch between parasitic capacitance and a membrane capacitor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A synaptic circuit comprising:
a weight memory configured to store a weight value;
a current-mode digital-to-analog converter (C-DAC) circuit configured to receive the weight value from the weight memory and to supply a current based on the weight value;
a parasitic capacitor correction circuit configured to receive the weight value from the weight memory and to correct a value of parasitic capacitance generated by the C-DAC circuit based on the weight value; and
a pre-discharge circuit configured to drain charges accumulated by the parasitic capacitance.

2. The synaptic circuit of claim 1, wherein the weight value is an n-bit binary number.

3. The synaptic circuit of claim 2, wherein the C-DAC circuit includes 'n' PMOS transistors and 'n' switches, and the parasitic capacitor correction circuit includes one inverter and 'n' switches,
wherein the parasitic capacitance is generated based on whether the 'n' switches included in the C-DAC circuit are opened or closed, with respect to the C-DAC circuit, and
wherein the parasitic capacitance is generated based on the 'n' switches included in the parasitic capacitor correction circuit are opened or closed, with respect to the parasitic capacitor correction circuit.

4. The synaptic circuit of claim 3, wherein it is determined, based on the weight value, whether the 'n' switches included in the C-DAC circuit are opened or closed, and
wherein it is determined, based on a result of inverting the weight value through the one inverter, whether the 'n' switches included in the parasitic capacitor correction circuit are opened or closed.

5. The synaptic circuit of claim 2, wherein the 'n' bits are 8 bits.

6. A spike neural network (SNN) circuit comprising:
a synaptic circuit array including a plurality of synaptic circuits arranged in 'n' rows and 'm' columns;
a plurality of spike generators electrically connected to correspond to the 'n' rows, respectively;
a plurality of neuron circuits electrically connected to correspond to the 'm' columns, respectively; and
a plurality of membrane capacitors electrically connected to correspond to the 'm' columns, respectively,
wherein each of the plurality of synaptic circuits includes:
a weight memory configured to store a weight value;
a C-DAC circuit configured to receive the weight value from the weight memory and to supply a current based on the weight value;
a parasitic capacitor correction circuit configured to receive the weight value from the weight memory and to correct a value of parasitic capacitance generated by the C-DAC circuit based on the weight value; and
a pre-discharge circuit configured to drain charges accumulated by the parasitic capacitance.

7. The SNN circuit of claim 6, wherein the weight value is an n-bit binary number.

8. The SNN circuit of claim 7, wherein the C-DAC circuit includes 'n' PMOS transistors and 'n' switches, wherein the parasitic capacitor correction circuit includes one inverter and 'n' switches, wherein the parasitic capacitance is generated based on whether the 'n' switches included in the C-DAC circuit are opened or closed, with respect to the C-DAC circuit, and wherein the parasitic capacitance is generated based on the 'n' switches included in the parasitic capacitor correction circuit are opened or closed, with respect to the parasitic capacitor correction circuit.

9. The SNN circuit of claim 8, wherein it is determined, based on the weight value, whether the 'n' switches included in the C-DAC circuit are opened or closed, and wherein it is determined, based on a result of inverting the weight value through the one inverter, whether the 'n' switches included in the parasitic capacitor correction circuit are opened or closed.

10. The SNN circuit of claim 6, wherein a first neuron circuit among the plurality of neuron circuits receives a signal accumulated from a plurality of synaptic circuits arranged in a first column of the synaptic circuit array, and wherein, when a potential by the accumulated signal exceeds a fire reference potential of the first neuron circuit, the first neuron circuit outputs a spike voltage.

11. The SNN circuit of claim 6, wherein each of the plurality of spike generator includes:

a first NAND operator configured to output a spike sub-voltage; and a second NAND operator configured to output a spike main voltage.

12. The SNN circuit of claim 11, wherein the first NAND operator is configured to:

receive a first voltage, which is an input voltage entered into each of the plurality of spike generator, and a second voltage generated after the input voltage passes through five inverters connected in series; and generate the spike sub-voltage by performing a NAND operation on the first voltage and the second voltage, and wherein the second NAND operator is configured to:

receive the first voltage and a third voltage generated after the input voltage passes through six inverters connected in series; and generate the spike main voltage by performing the NAND operation on the first voltage and the third voltage.

13. The SNN circuit of claim 7, wherein the 'n' bits are 8 bits.

\* \* \* \* \*